United States Patent
Strickler

(10) Patent No.: US 9,187,825 B2
(45) Date of Patent: Nov. 17, 2015

(54) METHOD OF DEPOSITING AND ELECTRICALLY CONDUCTIVE TITANIUM OXIDE COATING

(75) Inventor: David A. Strickler, Toledo, OH (US)

(73) Assignee: PILKINGTON GROUP LIMITED, St. Helens (GB)

( * ) Notice: Subject to any disclaimer, the term of this patent is extended or adjusted under 35 U.S.C. 154(b) by 1000 days.

(21) Appl. No.: 13/138,241

(22) PCT Filed: Jan. 29, 2010

(86) PCT No.: PCT/US2010/000246
§ 371 (c)(1),
(2), (4) Date: Jul. 22, 2011

(87) PCT Pub. No.: WO2010/087973
PCT Pub. Date: Aug. 5, 2010

(65) Prior Publication Data
US 2011/0281091 A1    Nov. 17, 2011

Related U.S. Application Data

(60) Provisional application No. 61/149,071, filed on Feb. 2, 2009.

(51) Int. Cl.
| | |
|---|---|
| *C03C 17/36* | (2006.01) |
| *C03C 17/245* | (2006.01) |
| *C23C 16/40* | (2006.01) |
| *C03C 17/34* | (2006.01) |

(52) U.S. Cl.
CPC ........... *C23C 16/405* (2013.01); *C03C 17/2456* (2013.01); *C03C 17/3482* (2013.01); *C03C 2217/212* (2013.01); *C03C 2217/94* (2013.01); *C03C 2218/152* (2013.01); *Y10T 428/24942* (2015.01)

(58) Field of Classification Search
CPC .. C03C 17/36; C03C 17/366; C03C 17/3652; C03C 2217/212; C03C 2217/477
USPC ........................................ 427/376.2; 65/60.5
See application file for complete search history.

(56) References Cited

U.S. PATENT DOCUMENTS

| | | |
|---|---|---|
| 4,780,306 A | 10/1988 | Ishii |
| 5,958,543 A | 9/1999 | Teng et al. |
| 7,037,830 B1 | 5/2006 | Rumer et al. |

FOREIGN PATENT DOCUMENTS

| | | |
|---|---|---|
| JP | 10-226598 A | 8/1998 |
| WO | WO 98/06675 A1 | 2/1998 |

OTHER PUBLICATIONS

D.S. Ginley and M.L. Knotek; Hydrogen in TiO2 Photoanodes; J. Electrochem Soc: Electrochemical Science and Technology ; Dec. 1979; pp. 2163-2166; vol. 126.
Sarah R. Kurtz and Roy G. Gordon; Chemical Vapor Deposition of Doped TiO2 Thin Films; Thin Solid Films; Mar. 1987; pp. 167-176; vol. 147; Elsevier-Sequoia S.A., The Netherlands; XP025831489.

*Primary Examiner* — Jodi C Franklin
(74) *Attorney, Agent, or Firm* — Marshall & Melhorn, LLC

(57) ABSTRACT

A method of depositing an electrically conductive titanium oxide coating on a glass substrate, preferably by atmospheric chemical vapor deposition in a float glass manufacturing process, utilizes a precursor gas mixture including a halogenated, inorganic titanium compound, an organic oxygen containing compound, a reducing gas and one or more inert carrier gases.

17 Claims, No Drawings

METHOD OF DEPOSITING AND ELECTRICALLY CONDUCTIVE TITANIUM OXIDE COATING

RELATED APPLICATIONS

This application, which is a national phase filing under 35 USC 371 of PCT international application No. PCT/US2010/000246 filed Jan. 29, 2010, pending as of the filing of the present application, claims the benefit of and priority to provisional application No. 61/149,071 filed Feb. 2, 2009, the contents of which are hereby incorporated by reference.

FIELD OF THE INVENTION

The present invention relates to a method of depositing an electrically conductive titanium oxide coating on a glass substrate.

BACKGROUND OF THE INVENTION

Titanium oxide coatings are known to have many uses due to their resistance to physical and chemical attack. For example, $TiO_2$ coatings are very resistant to abrasion and have thus been used as an overcoat in multi-layer thin film stacks. Likewise it is known that such $TiO_2$ coatings can protect more delicate coatings from, for example, oxidation due to exposure to the elements.

Such attributes of $TiO_2$ coatings as just described could be beneficially utilized in, for example, photovoltaic devices, if such $TiO_2$ coatings could also be made moderately electrically conductive, so as to enhance the overall efficiency of conversion of solar energy to electrical energy in such photovoltaic devices. It would also be highly desirable if such coatings could be manufactured economically so as to be useful in the large scale production of, for example, solar panels.

Deposition of $TiO_2$ films having a wide variety of different properties has been reported in the scientific literature, for example: Kurtz, S. R. and Gordon, R. G., "Chemical Vapor Deposition of Doped $TiO_2$ Thin Films", Thin Solid Films, Vol. 147, pgs. 167-176 (1987) and Ginley, D. S. and Knotek, M. L., "Hydrogen in $TiO_2$ Photoanodes", J. Electrochem Soc., Vol. 126, pgs. 2163-2166, (1979)

Deposition of $TiO_2$ films having selectively enhanced properties also appears in the patent literature, for example:

U.S. Pat. No. 4,780,306 describes an electrically conductive material of titanium dioxide crystal including at least one electrically conductive portion and at least one less conductive portion, and a method of producing the electrically conductive material, which includes the steps of applying a catalyst to the surface of the crystal and heating the crystal at a temperature of 300° C. to 600° C. in a gas atmosphere containing an oxidizing gas and a reducing gas.

U.S. Pat. No. 5,958,543 describes a thin film, magnetic disk media having micro-texturing provided by hydrogen-treated, sputter-deposited titanium nodules.

U.S. Pat. No. 7,037,830 describes a physical vapor deposition sputtering process for enhancing the preferred crystalline orientation of a titanium layer by using hydrogen before or during the deposition process.

SUMMARY OF THE INVENTION

The present invention relates to a method of depositing an electrically conductive titanium oxide coating by atmospheric chemical vapor deposition during a float glass manufacturing process.

More specifically, the method of depositing the electrically conductive titanium oxide coating involves forming a uniform precursor gas mixture including the primary constituents of a halogenated, inorganic titanium compound, an organic oxygen containing compound, a reducing gas and one or more inert carrier gases. The reducing gas comprises no more than 10 mole % of the precursor gas mixture and is distinguished from those reducing gases that may constitute a component of the gaseous mixture comprising the float bath atmosphere and/or carrier gases.

The precursor gas mixture is brought into proximity to the heated glass ribbon in the float glass manufacturing process. The heated glass ribbon is at a substantially higher temperature than the precursor gas mixture, the heat input from the glass ribbon causes the precursor gas mixture to chemically react so as to form a pyrolytic, doped titanium oxide coating on the glass ribbon at commercially viable deposition rates of greater than 10 Å/sec. The doped titanium oxide film exhibits an electrical conductivity of greater than $1 \times 10^{-2}$ S/cm (or $ohm^{-1} cm^{-1}$).

DETAILED DESCRIPTION OF THE INVENTION

The present invention relates to a method of depositing an electrically conductive titanium oxide coating by atmospheric chemical vapor deposition during a float glass manufacturing process. The coating is made electrically conductive by inclusion of a reducing gas as a component of the precursor gas mixture utilized in accordance with the invention, as will be described in more detail hereinafter. While an electrically conductive titanium oxide coating may have other uses, it is thought to be particularly useful in photovoltaic devices, more particularly, solar cells.

In a typical solar cell, a transparent conductive oxide (TCO) often overlays the so-called "active" or photovoltaic layer of the solar cell, formed preferably from thin film silicon. Providing a layer of material having certain desirable properties at the interface of the TCO and the active layer is seen as a potential means of cost effectively increasing the efficiency of conversion of solar radiation to electrical energy. Electrically conductive $TiO_2$ has been suggested as a good candidate for such an interface layer for two reasons, including at least: (1) that the $TiO_2$ is chemically and thermally stable enough that the active layer can be deposited directly onto it; and (2) due to its refractive index (between 2.5 and 3.5) in combination with the refractive indices of adjacent layers, it would reduce the amount of light lost due to reflection.

It is also important that, while the $TiO_2$ layer need not be highly conductive, that it be at least as electrically conductive as the active layer so as not to form a barrier to electrical current flow between the TCO and the active layer.

In order to realize the benefit of an electrically conductive $TiO_2$ interface layer, two main problems must be overcome. The first problem is to make a $TiO_2$ compound which is both electrically conductive and stable. Creating a conductive TiO2 coating is difficult in that pure titanium oxide is, essentially, an insulator. Having a relatively stable compound is necessary to deposit the desired coating via atmospheric chemical vapor deposition (APCVD) during the float glass manufacturing process. The second problem to be overcome is to be able to produce such an electrically conductive coating in large volume and at low cost to make it useful in large-scale solar cell manufacturing processes. The present invention solves both of the foregoing problems.

Initially, a combination of gaseous reactants, namely a halogenated, inorganic titanium compound and an organic oxygen-containing compound may be provided. Suitable inorganic titanium halide compounds include: $TiCl_4$, titanium bromide, and titanium iodide compounds. Titanium compounds such as titanium ethoxide and titanium isopropoxide are potentially useful in connection with the invention. Suitable organic oxygen-containing compounds include: ethyl acetate, t-butyl acetate and the like.

In order to make the proposed $TiO_2$ layer electrically conductive, addition of a reducing gas is preferred. Suitable reducing gases include: hydrogen, ammonia, and carbon monoxide. The applicants have found that addition of gaseous hydrogen at a level of no more than 10 mole % is sufficient to provide the desired level of electrical conductivity.

Applicants have surprisingly found that electrical conductivity of greater than $1 \times 10^{-2}$ Siemens (S)/cm can be induced in $TiO_2$ in online production of pyrolytic thin films by APCVD as described herein.

The $TiO_2$ film can be deposited by APCVD directly on a hot glass substrate, but is preferably deposited as part of a multi-layer film stack for solar cell purposes. For example, the subject $TiO_2$ coating may be deposited over a preexisting film stack comprising doped $SnO_2$, or other electrically conductive metal oxides having a refractive index less than 2.0, and thin layers of silica and undoped $SnO_2$. A glass coated with such a preexisting film stack is sold by Pilkington North America, Inc. as its TEC™ line of products.

As previously mentioned, the conductive $TiO_2$ layer, when utilized at the interface of the TCO and active layers, reduces the reflection of light. Also, the process conditions utilized for deposition of amorphous silicon on the TCO can chemically reduce the surface of the TCO and thereby increase light absorption in the TCO by several percent. Titania is less susceptible to chemical reduction than $SnO_2$:F, so it may protect the $SnO_2$:F during subsequent processing.

In consideration of the various benefits of the conductive $TiO_2$ interfacial layer in a solar cell, applicants have found that an increase in conversion efficiency of between 8% and 10% can be expected in a typical thin film silicon solar cell wherein the refractive index of a typical silicon layer is at least 4.5.

For some applications of the present invention, it may be desirable to suppress iridescence effects which can occur when light is reflected from, or transmitted through, a filmed glass substrate. In connection with the present invention, any suitable single layer or multi-layer color suppression film stack may be utilized, including a single metal oxide layer, a metal oxide layer and silica layer, or a gradient coating layer.

In a preferred embodiment, a metal oxide layer and a silica layer together form an excellent color suppression film stack, as is known from, for example, the Gordon U.S. Pat. Nos. 4,377,613 and 4,419,386, which are herein incorporated by reference. The color suppression film stack is deposited on the substrate material, prior to deposition of the electrically conductive metal oxide layer. The color suppression film stack is relatively thin, the tin oxide layer having a thickness of 250-600 Å, and the silica layer having a thickness of 250-350 Å.

To practice the APCVD method of film deposition, a gaseous mixture is maintained at a temperature below that at which it reacts to form the material to be deposited, and is delivered to a location near a flat glass substrate to be coated, the substrate being at a temperature above the reaction temperature of the reactants. The precursor gas mixture is thereafter introduced into the vapor space directly over the substrate. The heat from the substrate raises the temperature of the precursor gas above the thermal decomposition temperature of the precursor compounds.

High deposition rates are important from a practical standpoint when coating substrates in a manufacturing process. This is particularly true for an on-line float glass process, where the glass ribbon is traveling at a specific line speed and where a specific coating thickness is required.

A float glass installation is utilized as a means for practicing the method of the present invention. One specific example of a float glass installation is hereinafter described. The float glass apparatus more particularly comprises a canal section along which molten glass is delivered from a melting furnace, to a float bath section wherein a continuous glass ribbon is formed in accordance with the well-known float process. The glass ribbon advances from the bath section through an adjacent annealing lehr and a cooling section. The continuous glass ribbon serves as the substrate upon which the desired coating is deposited in accordance with the present invention.

The float section includes a bottom section within which a bath of molten tin is contained, a roof, opposite side walls, and end walls. The roof, side walls, and end walls together define an enclosure in which a non-oxidizing atmosphere is maintained to prevent oxidation of the molten tin.

Additionally, gas distributor beams are located in the bath section. The gas distributor beams in the bath section may be employed to apply additional coatings onto the substrate prior to applying the metal oxide coating by the method of the present invention. The additional coatings may include silicon and silica.

In operation, the molten glass flows along the channel beneath a regulating tweel and downwardly onto the surface of the tin bath in controlled amounts. On the tin bath the molten glass spreads laterally under the influences of gravity and surface tension, as well as certain mechanical influence, and it is advanced across the bath to form the ribbon. The ribbon is removed over lift out rolls and is thereafter conveyed through the annealing lehr and the cooling section on aligned rolls. The application of the coating of the present invention may take place in the float bath section, or further along the production line, for example, in the gap between the float bath and the annealing lehr, or in the annealing lehr.

A suitable non-oxidizing atmosphere, generally nitrogen, or a mixture of nitrogen and hydrogen in which nitrogen predominates, is maintained in the bath enclosure to prevent oxidation of the tin bath. The atmosphere gas is admitted through conduits operably coupled to a distribution manifold. The non-oxidizing gas is introduced at a rate sufficient to compensate for normal losses and maintain a slight positive pressure, on the order of about 0.001 to about 0.01 atmosphere above ambient atmospheric pressure, so as to prevent infiltration of outside atmosphere. For purposes of the present invention the above-noted pressure range is considered to constitute normal atmospheric pressure. Heat for maintaining the desired temperature regime, generally 600°-750° C., in the tin bath and the enclosure may be provided by radiant heaters within the enclosure. The atmosphere within the lehr is typically atmospheric air, as the cooling section is not enclosed and the glass ribbon is open to the ambient atmosphere. Ambient air may be directed against the glass ribbon, for example, by fans, in the cooling section. Heaters may also be provided within the annealing lehr for causing the temperature of the glass ribbon to be gradually reduced in accordance with a predetermined regime as it is conveyed therethrough.

Gas distributor beams are generally positioned in the float bath to deposit the various coatings on the glass ribbon substrate but might be positioned downstream of the float bath. The gas distributor beam is one form of reactor that can be employed in practicing the process of the present invention.

A conventional configuration for the distributor beams suitable for supplying the precursor materials in accordance with the invention is, generally, an inverted generally channel-shaped framework formed by spaced inner and outer walls and defining at least two enclosed cavities. A suitable heat exchange medium is circulated through the enclosed cavities in order to maintain the distributor beams at a desired temperature. A preferred distributor beam is disclosed in U.S. Pat. No. 4,504,526 to Hofer et al., which is incorporated herein by reference.

The precursor gas mixture is supplied through a fluid-cooled supply conduit. The supply conduit extends along the distributor beam and admits the gas through drop lines spaced along the supply conduit. The supply conduit leads to a delivery chamber within a header carried by the framework. Precursor gases admitted through the drop lines are discharged from the delivery chamber through a passageway toward a coating chamber defining a vapor space opening onto the glass where they flow along the surface of the glass.

Baffle plates may be provided within the delivery chamber for equalizing the flow of precursor materials across the distributor beam to assure that the materials are discharged against the glass in a smooth, laminar, uniform flow entirely across the distributor beam. Spent precursor materials are collected and removed through exhaust chambers along the sides of the distributor beam.

Various forms of distributor beams used for chemical vapor deposition are suitable for the present method and are known in the prior art.

One such alternative distributor beam configuration generally introduces the precursor gas mixture through a gas supply duct where it is cooled by cooling fluid circulated through cooling ducts. The gas supply duct opens through an elongated aperture into a gas flow restrictor.

The gas flow restrictor comprises a plurality of metal strips longitudinally crimped in the form of a sine wave and vertically mounted in abutting relationship with one another extending along the length of the distributor. Adjacent crimped metal strips are arranged "out of phase" to define a plurality of vertical channels between them. These vertical channels are of small cross-sectional area relative to cross-sectional area of the gas supply duct, so that the gas is released from the gas flow restrictor at substantially constant pressure along the length of the distributor.

The coating gas is released from the gas flow restrictor into the inlet side of a substantially U-shaped guide channel generally comprising an inlet leg, a coating chamber which opens onto the hot glass substrate to be coated, and an exhaust leg, whereby used coating gas is withdrawn from the glass. The rounded corners of the blocks defining the coating channel promote a uniform laminar flow of coating parallel to the glass surface across the glass surface to be coated.

EXAMPLES

The following examples, which constitute the best mode presently contemplated by the inventors for practicing the invention, are presented solely for the purpose of further illustrating and disclosing the present invention, and are not to be construed as a limitation on the invention.

Comparative Examples C1-C5 show the deposition of $TiO_2$ films formed by the combination of vaporized $TiCl_4$, vaporized EtOAc, and in Examples C3, C4 and C5 molecular oxygen in a dynamic atmospheric chemical vapor deposition (APCVD) process. The results are shown in Table 1.

TABLE 1

| | | | Comparative Examples | | | | | |
|---|---|---|---|---|---|---|---|---|
| Example | Ti precursor | Ti concentration (%) | Ethyl acetate (%) | $O_2$ (%) | $H_2$ (%) | Total gas flow (slm) | Line Speed (ipm) | Sheet Resistance (ohm/sq) |
| C1 | $TiCl_4$ | 0.62 | 1.23 | 0 | 0 | 27 | 150 | 1.97E+12 |
| C2 | $TiCl_4$ | 0.31 | 0.92 | 1.67 | 0 | 27 | 150 | 5.44E+13 |
| C3 | $TiCl_4$ | 0.31 | 0.92 | 0 | 0 | 27 | 150 | 2.02E+12 |
| C4 | $TiCl_4$ | 0.62 | 1.84 | 1.67 | 0 | 27 | 150 | 2.32E+13 |
| C5 | $TiCl_4$ | 0.31 | 0.61 | 3.33 | 0 | 27 | 150 | 5.99E+12 |

| Example | Resisitivity (ohm-cm) | Conductivity (S/cm) | Thickness (Å) | Deposition Rate (Å/s) |
|---|---|---|---|---|
| C1 | 1.15E+07 | 8.70E-08 | 592 | 91 |
| C2 | 1.68E+08 | 5.97E-09 | 308 | 48 |
| C3 | 1.01E+07 | 9.90E-08 | 500 | 78 |
| C4 | 7.97E+07 | 1.25E-08 | 344 | 54 |
| C5 | 2.01E+07 | 4.98E-08 | 335 | 52 |

As can be seen, films of substantial thickness, from 300 to nearly 600 Å, were formed at respectable deposition rates of slightly less than 50 Å/sec to just over 90 Å/sec. However, the conductivity of all the sample was very low, namely from almost $6\times10^{-9}$ S/cm to only $1.2510^{-8}$ S/cm. Thus, these examples are not within the scope of the present invention.

Examples 1-4, according to the invention are included in Table 2. In addition to vaporized $TiCl_4$, and EtOAc, gaseous hydrogen was added to the gaseous precursor mixture in amounts of 3-5.2 wt %. It will be noted that no molecular oxygen was utilized in Examples 1-4 according to the invention, but the proportion of EtOAc was substantially increased over the comparative Examples.

TABLE 2

| | | | Examples according to the Invention | | | | | |
|---|---|---|---|---|---|---|---|---|
| Example | Ti precursor | Ti concentration (%) | Ethyl acetate (%) | $O_2$ (%) | $H_2$ (%) | Total gas flow (slm) | Line Speed (ipm) | Sheet Resistance (ohm/sq) |
| 1 | $TiCl_4$ | 1.24 | 6.13 | 0 | 5.19 | 27 | 125 | 260122 |
| 2 | $TiCl_4$ | 0.62 | 1.23 | 0 | 5.19 | 27 | 125 | 603725 |
| 3 | $TiCl_4$ | 1.24 | 2.45 | 0 | 3.00 | 27 | 125 | 295782 |
| 4 | $TiCl_4$ | 0.62 | 1.84 | 0 | 3.00 | 27 | 125 | 300088 |

| Example | Resisitivity (ohm-cm) | Conductivity (S/cm) | Thickness (Å) | Deposition Rate (Å/s) |
|---|---|---|---|---|
| 1 | 1.1 | $8.9 \times 10^{-1}$ | 430 | 56 |
| 2 | $6.6 \times 10^{-1}$ | 1.5 | 110 | 14 |
| 3 | $5.3 \times 10^{-1}$ | 1.9 | 180 | 23 |
| 4 | $4.8 \times 10^{-1}$ | 2.1 | 160 | 21 |

The thickness of the films formed ranged from 110 Å to 430 Å, although tending to be in the lower end of that range. Deposition rates ranged from 14-56 Å/sec. Significantly, however, the conductivity of the films was greatly increased over those of the comparative Examples, in particular ranging from 0.89 S/cm to 2.1 S/cm. These conductivity levels are in a range useful in improving performance of photovoltaic devices for the reasons previously noted herein.

The present invention has been described in an illustrative manner. Many modifications and variations of the present invention will occur to those skilled in the art of thin films in light of the teachings herein. Therefore, applicants submit that within the scope of the appended claims, the present invention may be practiced otherwise than as specifically described.

What is claimed is:

1. A method of depositing an electrically conductive titanium oxide coating by atmospheric chemical vapor deposition on a glass substrate during a glass manufacturing process comprising:
   providing a heated glass ribbon in a float bath;
   in a reactor, forming a uniform precursor gas mixture comprising a halogenated, inorganic titanium compound, an organic oxygen-containing compound, a reducing gas, and one or more inert carrier gases, wherein the reducing gas comprises no more than 10 mole % of the precursor gas mixture; and
   delivering the precursor gas mixture from the reactor at a temperature below the thermal decomposition temperature of the precursor gas mixture to a location adjacent the heated glass ribbon to be coated, the float bath atmosphere surrounding the heated glass ribbon being essentially at atmospheric pressure;
   wherein the temperature of the heated glass ribbon is sufficient to cause reaction of the precursor gas mixture so as to deposit a titanium oxide coating at a deposition rate greater than 10 Å/sec. on the glass ribbon to form a coated glass article exhibiting an electrical conductivity of greater than $1 \times 10^{-2}$ S/cm.

2. The method defined in claim 1, wherein when the precursor gas mixture delivered to the glass ribbon, the glass ribbon is at a temperature of from 1050° F. to 1350° F.

3. The method defined in claim 1, wherein the titanium compound comprises $TiCl_4$.

4. The method defined in claim 1, wherein the reducing gas comprises hydrogen.

5. The method defined in claim 4, wherein the organic oxygen containing compound comprises an organic ester.

6. The method defined in claim 5, wherein the organic ester comprises ethyl acetate.

7. The method defined in claim 1, wherein the inert carrier gases comprise one or more of helium and nitrogen.

8. The method defined in claim 1, wherein a color suppression film stack is deposited on the heated glass substrate prior to deposition of the electrically conductive titanium oxide coating.

9. The method defined in claim 1, wherein the coated glass oxide exhibits an electrical conductivity of at least 0.80 S/cm.

10. The method defined in claim 1, wherein the conductive titanium oxide coating is deposited on the heated glass substrate at a deposition rate of at least 20 Å/sec.

11. The method defined in claim 1, wherein the thickness of conductive titanium oxide coating deposited on the heated glass substrate is ≥110 Å.

12. The method defined in claim 1, wherein the reducing gas comprises no more than 5.2 mole % of the precursor mixture.

13. The method defined in claim 1, wherein the coated glass article exhibits an electrical conductivity of at least 0.89 S/cm.

14. The method defined in claim 1, wherein the titanium compound comprises $TiCl_4$, the reducing gas comprises hydrogen, and the organic oxygen-containing compound comprises ethyl acetate.

15. The method defined in claim 1, wherein a doped tin oxide film is deposited on the heated glass ribbon prior to deposition of the electrically conductive titanium oxide coating.

16. The method defined in claim 1, wherein the reactor is positioned in the float bath.

17. A method of depositing an electrically conductive titanium oxide coating by atmospheric chemical vapor deposition on a glass substrate during a glass manufacturing process comprising:
   providing a heated glass ribbon in a float bath;
   forming a uniform precursor gas mixture comprising a halogenated, inorganic titanium compound, an organic oxygen-containing compound, a reducing gas, and one or more inert carrier gases, wherein the reducing gas comprises no more than 10 mole % of the precursor gas mixture; and thereafter
   delivering the precursor gas mixture to a vapor space directly over a surface of the heated glass ribbon to be coated, the float bath atmosphere surrounding the heated glass ribbon being essentially at atmospheric pressure;

wherein the temperature of the heated glass ribbon is sufficient to cause reaction of the precursor gas mixture so as to deposit a titanium oxide coating at a deposition rate greater than 10 Å/sec. on the glass ribbon to form a coated glass article exhibiting an electrical conductivity of greater than $1 \times 10^{-2}$ S/cm.

* * * * *

UNITED STATES PATENT AND TRADEMARK OFFICE
CERTIFICATE OF CORRECTION

PATENT NO.        : 9,187,825 B2                                    Page 1 of 1
APPLICATION NO.   : 13/138241
DATED             : November 17, 2015
INVENTOR(S)       : David A. Strickler It is certified that error appears in the above-identified patent and that said Letters Patent is hereby corrected as shown below:

In The Claims

Column 8, line 29, "oxide" should read --article--.

Signed and Sealed this
Twelfth Day of April, 2016

Michelle K. Lee
*Director of the United States Patent and Trademark Office*